(12) United States Patent
Kang et al.

(10) Patent No.: US 11,837,278 B2
(45) Date of Patent: Dec. 5, 2023

(54) DRAM DEVICE AND ODT RESISTOR VALUE ADJUSTMENT METHOD AND COMPUTER PROGRAM FOR THE SAME

(71) Applicants: Sang-Seok Kang, Suwon-si (KR); Young-Hee Jung, Hwaseong-si (KR); Sun-Young Lee, Anyang-si (KR)

(72) Inventors: Sang-Seok Kang, Suwon-si (KR); Young-Hee Jung, Hwaseong-si (KR); Sun-Young Lee, Anyang-si (KR)

( * ) Notice: Subject to any disclaimer, the term of this patent is extended or adjusted under 35 U.S.C. 154(b) by 15 days.

(21) Appl. No.: 17/678,500

(22) Filed: Feb. 23, 2022

(65) Prior Publication Data
US 2022/0284946 A1 Sep. 8, 2022

(30) Foreign Application Priority Data
Mar. 4, 2021 (KR) .................. 10-2021-0028563

(51) Int. Cl.
*G11C 7/10* (2006.01)
*G11C 11/4093* (2006.01)
*G11C 5/04* (2006.01)
*G11C 11/4096* (2006.01)
*G11C 11/408* (2006.01)
*G11C 11/4076* (2006.01)

(52) U.S. Cl.
CPC ............ *G11C 11/4093* (2013.01); *G11C 5/04* (2013.01); *G11C 11/4082* (2013.01); *G11C 11/4096* (2013.01); *G11C 11/4076* (2013.01)

(58) Field of Classification Search
CPC .................................................. G11C 11/4093
See application file for complete search history.

(56) References Cited

U.S. PATENT DOCUMENTS 6,642,740 B2 * 11/2003 Kim .................. H03K 19/0005
326/83
2017/0279540 A1 * 9/2017 Tanizawa ............... H04B 10/70
2019/0042499 A1 * 2/2019 McCall .................. G06F 13/28

FOREIGN PATENT DOCUMENTS

KR 10-2019-0113507 10/2019

* cited by examiner

*Primary Examiner* — Min Huang
(74) *Attorney, Agent, or Firm* — KILE PARK REED & HOUTTEMAN PLLC

(57) ABSTRACT

Disclosed are a dynamic random access memory (DRAM) device, an on-die termination (ODT) resistance value setting method thereof, and a computer program therefor, and the DRAM device includes at least one DRAM module and a memory controller configured to measure a resistance value of an ODT resistor corresponding to one of a rank included in the DRAM module, a chipset included in the rank, and a DQ included in the chipset and set a resistance value of an ODT resistor corresponding to one of the rank, the chipset, and the DQ on the basis of the measured resistance value.

9 Claims, 5 Drawing Sheets

DRAM DEVICE AND ODT RESISTOR VALUE ADJUSTMENT METHOD AND COMPUTER PROGRAM FOR THE SAME

CROSS-REFERENCE TO RELATED APPLICATION

This application claims priority to and the benefit of Korean Patent Application No. 10-2021-0028563, filed on Mar. 4, 2021, the disclosure of which is incorporated herein by reference in its entirety.

BACKGROUND

1. Field of the Invention

The present invention relates to a dynamic random access memory (DRAM) device, a method of setting an on-die termination (ODT) resistance value thereof, and a computer program therefor, and more particularly, to a DRAM device that allows adjusting an ODT resistance value, a method of setting the ODT resistance value thereof, and a computer program therefor.

2. Discussion of Related Art

A dynamic random access memory (DRAM) device is provided in a computer device to store data and code for a processor to perform operations. A DRAM module constituting such a DRAM device is composed of at least four and at most thirty-six chipsets and has a great influence on the computational performance of computer devices.

Meanwhile, when data is transmitted from the chipset to the DRAM device, signal reflection may occur while a data signal output from an output buffer of the chipset is being input to an input buffer of the DRAM device. In order to prevent such signal reflection, DRAM devices have a termination resistor for impedance matching, i.e., an on-die termination (ODT) resistor.

However, although conventional DRAM devices have a function that allows an ODT resistance value to be adjusted in the DRAM device, it is difficult to adjust an ODT resistance value for each chipset or DQ in the module because one device can adjust only one ODT resistance value.

SUMMARY OF THE INVENTION

Accordingly, an object of the present invention is to provide a dynamic random access memory (DRAM) device capable of setting and adjusting a plurality of on-die termination (ODT) resistance values therein, a resistance value setting method thereof, and a computer program therefor.

Also, another object of the present invention is to provide a DRAM device capable of adjusting an ODT resistance value for each chipset or DQ in a system equipped with a plurality of DRAM devices, a resistance value setting method thereof, and a computer program therefor.

Also, still another object of the present invention is to provide a DRAM device capable of improving signal integrity even in a system that uses a high-capacity memory such as a server, a resistance value setting method thereof, and a computer program therefor.

The technical objects of the present invention are not limited to those mentioned above, and other objects that are not mentioned herein will be apparently understood by those skilled in the art from the following description.

The objects can be achieved by a dynamic random access memory (DRAM) device comprising at least one DRAM module and a memory controller configured to measure a resistance value of an on-die termination (ODT) resistor corresponding to one of a rank included in the DRAM module, a chipset included in the rank, and a DQ included in the chipset and set a resistance value of an ODT resistor corresponding to one of the rank, the chipset, and the DQ on the basis of the measured resistance value.

The memory controller may set the resistance value of the ODT resistor on the basis of a preset response time range according to training.

The memory controller may set a new resistance value of the ODT resistor corresponding to each of the rank, the chipset, and the DQ outside the preset response time range on the basis of the measured resistance value.

The memory controller may set the resistance value corresponding to one of the rank, the chipset, and the DQ by a mode register set composed of command and address pins and DQ pin information.

The DRAM module may include a multi-rank dual in-line memory module (DIMM) module.

In addition, the objects can be achieved by an on-die termination (ODT) resistance value setting method of a dynamic random access memory (DRAM), the ODT resistance value setting method including operations of allowing a memory controller to measure a resistance value of an ODT resistor corresponding to one of a rank included in a DRAM module, a chipset included in the rank, and a DQ included in the chipset and allowing the memory controller to set a resistance value of an ODT resistor corresponding to one of the rank, the chipset, and the DQ on the basis of the measured resistance value.

The operation of allowing the memory controller to set a resistance value of an ODT resistor may include an operation of setting the resistance value of the ODT resistor on the basis of a preset dispersion range for response times according to training.

The operation of allowing the memory controller to set a resistance value of an ODT resistor may include an operation of setting a new resistance value corresponding to each of the rank, the chipset, and the DQ outside the preset dispersion range for response times on the basis of the measured resistance value.

The operation of allowing the memory controller to set a resistance value of an ODT resistor may include an operation of setting the resistance value corresponding to one of the rank, the chipset, and the DQ by a mode register set composed of command and address pins and DQ pin information.

The DRAM module may include a multi-rank dual in-line memory module (DIMM) module.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Hereinafter, exemplary embodiments of the present invention will be described in detail with reference to the accompanying drawings.

Figure 1:
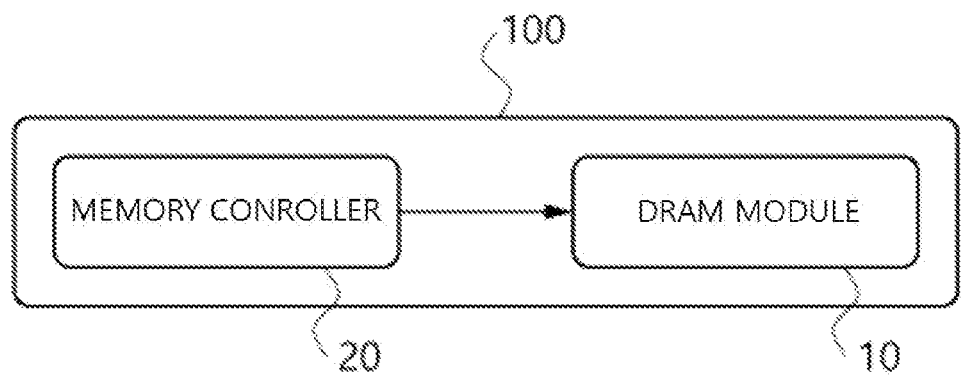
FIG. 1 is a diagram showing the configuration of a dynamic random access memory (DRAM) according to an embodiment of the present invention.

FIG. 1 is a diagram showing the configuration of a dynamic random access memory (DRAM) according to an embodiment of the present invention. As shown in FIG. 1, a DRAM device 100 according to an embodiment of the present invention includes at least one DRAM module 10 and a memory controller 20.

The DRAM module 10, which is a module for storing data and codes, includes a chipset C forming a physical memory device, a rank R composed of four, eight, or sixteen chipsets in addition to DQs included in each chipset, a slot S including two ranks, and a channel CN including a plurality of slots.

As described above, the DRAM module according to the present invention preferably includes a multi-rank dual in-line memory module (DIMM) module including a plurality of ranks.

The memory controller 20 measures the resistance value of an ODT resistor corresponding to one of a rank R included in the DRAM module 10, a chipset C constituting a rank, and a DQ included in the chipset C and sets the resistance value of the ODT resistor corresponding to one of the rank R, the chipset C, and DQ on the basis of the measured resistance value.

That is, the memory controller 20 according to the present invention sets the resistance value of the ODT resistor to be different for each of the rank R, the chipset C, and the DQ in one DRAM module 10, thereby minimizing signal reflection even when there is a difference in resistance for each chipset or DQ. Thus, it is possible to improve signal integrity.

Here, the memory controller 20 according to the present invention may set resistance value corresponding to one of the rank R, the chipset C, and the DQ using a mode register set (MRS). Specifically, the mode register set is configured to include DQ pin information in addition to command (/RAS, /CAS, /WE, etc.) pins and address (A0, A1, . . . , A17) pins and measures the response time of the rank R, the chipset C, and the DQ as parameters in picoseconds (ps) through training.

The memory controller 20 determines whether the measured values are within a preset range. When the rank R, the chipset C, and the DQ are outside the preset range, the memory controller 20 sets a new resistance value of the ODT resistor therefor.

The DRAM device 100 according to the present invention may set the resistance value of the ODT resistor differently for each DQ and set the resistance value of the ODT resistor for each chipset composed of 8 (4 to 16 in some cases) DQs. More broadly, the DRAM device 100 according to the present invention may set the resistance value of the ODT resistor for each rank including 64 DQs to constitute x64 and may set the resistance value of the ODT resistor differently for each slot composed of multiple ranks or channel composed of multiple slots.

Accordingly, with the DRAM device 100 according to the present invention, it is possible to improve signal integrity even when heavy loading occurs in a system that uses a high-capacity memory, such as a server.

Figure 2:
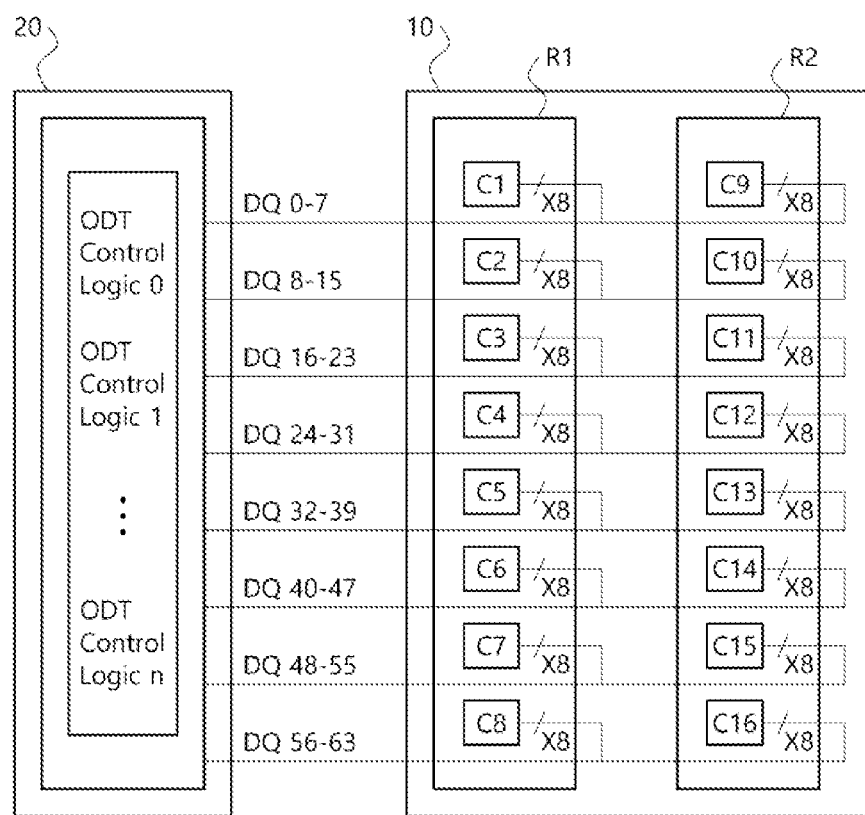
FIG. 2 is a diagram showing the configuration of a DRAM device according to another embodiment of the present invention.

FIG. 2 is a diagram showing the detailed configuration of a DRAM device according to an embodiment of the present invention. As shown in FIG. 2, the DRAM device 100 of the present invention may have a plurality of control logics (ODT Control Logic 0, ODT Control Logic 1, . . . , ODT Control Logic n) in order for the memory controller 20 to set the resistance value of the ODT resistor differently for each of the rank R, the chipset C, and the DQ and may set the resistance value of the ODT resistor for each DQ in the chipset C using the plurality of control logics.

Here, when eight DQs are in one chipset C, it is preferable that the control logics transmit signals for ODT resistance values corresponding to the eight DQs to corresponding chipsets. The control logic of the memory controller 20 according to the present invention may set one ODT resistance value for one DRAM module 20 using the mode register set or may set an ODT resistance value for each DQ in the smallest range.

Figure 3:
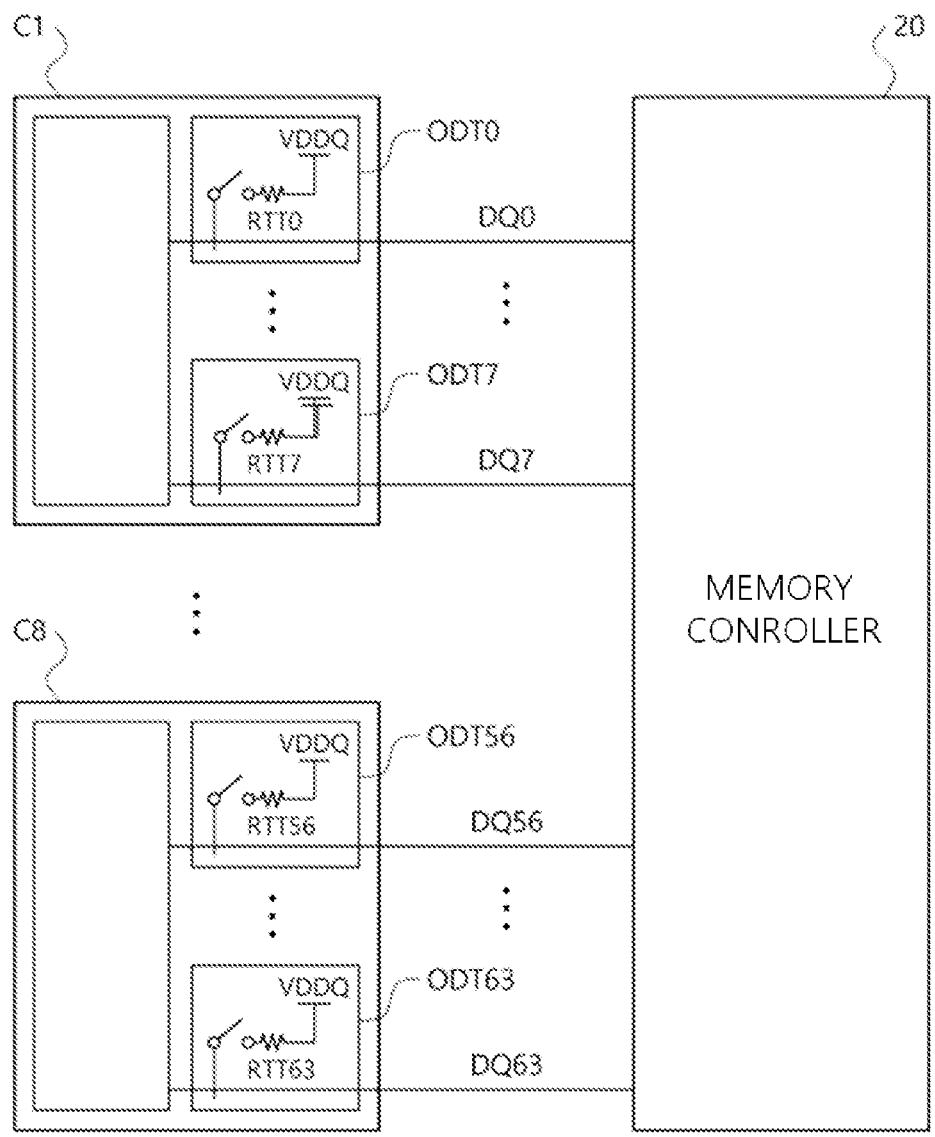
FIG. 3 is a diagram showing the configuration of a chipset of a DRAM device according to an embodiment of the present invention.

FIG. 3 is a diagram showing the configuration of a chipset C of the DRAM device 100 according to the present invention. As shown in FIG. 3, eight DQs are included in the chipset C according to the present invention, and variable resistors RTT0, RTT1, . . . , and RTT7 are provided in each DQ to set the ODT resistance values differently. When the resistance value for each DQ is delivered by the control logics of the memory controller 20, the resistance value of the ODT resistor is set for each DQ according to the delivered resistance value.

Figure 4:
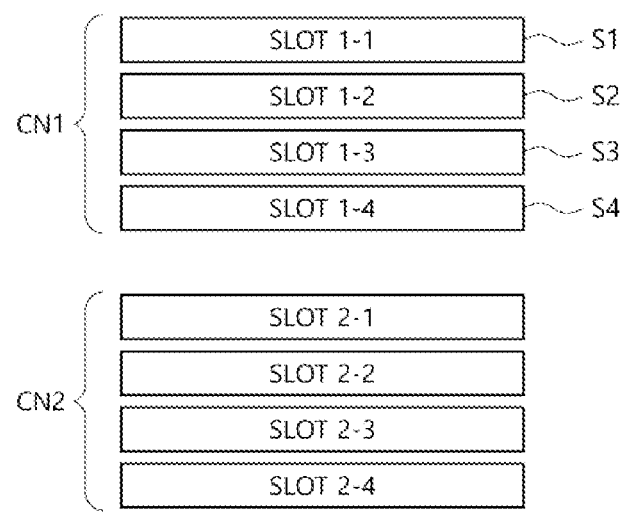
FIG. 4 is a block diagram showing the configuration of a channel of a DRAM device according to an embodiment of the present invention.

Thus, at most eight different DQ in one chipset may have corresponding OTD resistance values, and 64 DQs in one rank may have corresponding ODT resistance values. FIG. 4 is a showing the configuration of a channel of a DRAM device according to the present invention. As shown in FIG. 4, the DRAM device 100 according to the present invention includes four different slots S1, S2, S3, and S4 in one channel. Here, two ranks may be included in one slot, and as described above, eight chipsets C may be included in one rank R, and eight DQs may be included in one chipset C.

Thus, ODT resistance values for at most 512 DQs may be in one channel.

Figure 5:
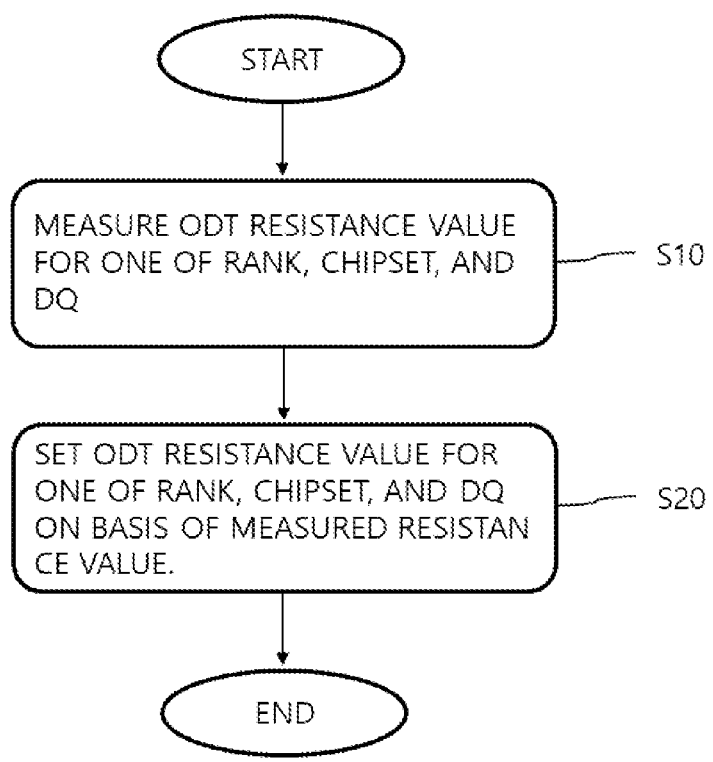
FIG. 5 is a flowchart showing an ODT resistance value setting method of a DRAM device according to an embodiment of the present invention.

An ODT resistance value setting method of a DRAM device according to the present invention will be described in detail below with reference to FIG. 5.

First, the memory controller 20 measures the resistance value of the ODT resistor corresponding to one of the rank included in the DRAM module 10, the chipset C constituting rank R, and the DQ included in the chipset C (S10).

Here, it is preferable that the memory controller 20 measures the response time of each of the rank R, the chipset C, and the DQ as parameters in units of picoseconds (ps), and the method may further include storing the measured resistance value of the ODT resistor for each of the rank R, the chipset C, and the DQ.

As an example of the ODT resistance value setting method of the DRAM device according to the present invention, the memory controller 20 measures parameters of DQO to DQ7 included in a first chipset Cl of the DRAM module 10 and then stores the resistance value of the ODT resistor for each DQ.

Also, in the same way, the memory controller 20 measures parameters of DQ57 to DQ63 included in an eighth chipset C8 and then stores the resistance value of the ODT resistor for each DQ.

When there are two ranks, the memory controller 20 measures a parameter for each DQ included in each of a ninth chipset C to a sixteenth chipset C and stores the resistance value of the ODT resistor.

Subsequently, the memory controller 20 sets the resistance value of the ODT resistor corresponding to one of the rank R, the chipset C and the DQ on the basis of the resistance value measured in operation S10 (S20).

In this case, the memory controller 20 may set the resistance value of the ODT resistor on the basis of a preset dispersion range for response times according to training and may set a new resistance value corresponding to each of the rank R, the chipset C, and the DQ outside the preset dispersion range for response times.

For example, when the parameters of DQO to DQ5 included in the first chipset Cl of the DRAM module 10 have a range of 10 to 20 ps and the parameters of DQ6 and DQ7 are measured as values of 50 ps and 55 ps, the memory controller 20 may set the resistance values of the ODT resistors ODT of DQ6 and DQ7 to be lower. Also, it is also possible for the memory controller 20 to newly set the ODT resistance value of DQ6 and DQ7 through re-raining.

Through the setting operation, the memory controller 20 may set the resistance value of the ODT resistor differently for each of the rank R, the chipset C, and the DQ satisfying a preset reference condition.

In this process, the memory controller 20 may differently set a dispersion range that satisfies the reference condition, and when the dispersion range is less than or equal to a preset value, the memory controller 20 may also set the same ODT resistance values for DQs belonging to the range.

Here, in operation S20, it is preferable to set a resistance value corresponding to one of the rank, the chipset, and the DQ by a mode register set composed of command and address pins and DQ pin information.

Accordingly, the DRAM device according to the present invention may set the resistance value of the ODT resistor for each DQ included in the chipset in the smallest range and may set the resistance value of the ODT resistor for each channel of the DRAM device in the largest range. Thus, it is possible to set and variously adjust an ODT resistance value in one or a plurality of DRAM devices, thereby improving signal integrity regardless of device specifications or performance.

The operations of the ODT resistance value setting method of the DRAM device according to the above-described embodiments may be implemented at least partially as a computer program and recorded in a computer-readable recording medium. A computer-readable recording medium where a program for implementing the operations of the ODT resistance value setting method according to the embodiments is recorded includes any kind of recording device where computer-readable data is stored. Examples of the computer-readable recording medium include read-only memory (ROM), random-access memory (RAM), CD-ROMs, magnetic tapes, floppy disks, optical image storage devices, etc. Also, the computer-readable recording medium can also be distributed over network-coupled computer systems so that computer-readable codes are stored and executed in a distributed fashion. Also, functional programs, codes, and code segments for implementing the embodiment may be easily understood by those skilled in the art.

With the DRAM device, the resistance value setting method thereof, and the computer program therefor according to the present invention, it is possible to set and adjust a plurality of ODT resistance values in one DRAM device.

Also, with the DRAM device, the resistance value setting method thereof, and the computer program therefor according to the present invention, it is possible to adjust an ODT resistance value for each chipset or DQ even in a system equipped with a plurality of DRAM device.

Also, with the DRAM device, the resistance value setting method thereof, and the computer program therefor according to the present invention, it is possible to improve signal integrity even in a system that uses a high-capacity memory such as a server.

It should be noted that the advantageous effects of the present invention are not limited to the above-described effects, and other effects that are not described herein will be apparent to those skilled in the art from the following descriptions.

While the present invention has been described with reference to embodiments shown in the accompanying drawings, it should be understood by those skilled in the art that these are merely exemplary and that various modifications and equivalents of the embodiments are possible therefrom. However, the modifications should be considered to be within the technical scope of the present invention. Therefore, actually, the technical scope of the present invention should be defined by the appended claims.

What is claimed is:

1. A dynamic random access memory (DRAM) device comprising:
    a DRAM module; and
    a memory controller configured to measure a resistance value of an on-die termination (ODT) resistor corresponding to a DQ included in a chipset and set a resistance value of an ODT resistor corresponding to the DQ on a basis of the measured resistance value, wherein
    the memory controller sets the resistance value corresponding to the DQ by a mode register set composed of command pins, address pins, and DQ pin information.

2. The DRAM device of claim 1, wherein the memory controller sets a new resistance value of the ODT resistor corresponding to the DQ outside a preset response time range on the basis of the measured resistance value.

3. The DRAM device of claim 1, wherein the DRAM module includes a multi-rank dual in-line memory module (DIMM) module.

4. An on-die termination (ODT) resistance value setting method of a dynamic random access memory (DRAM), the ODT resistance value setting method comprising operations of:
    allowing a memory controller to measure a resistance value of an ODT resistor corresponding to a DQ included in a chipset; and
    allowing the memory controller to set a resistance value of an ODT resistor corresponding to the DQ on a basis of the measured resistance value, wherein
    the memory controller sets the resistance value corresponding to the DQ by a mode register set composed of command pins, address pins, and DQ pin information.

5. The ODT resistance value setting method of claim 4, wherein the operation of allowing the memory controller to set a resistance value of an ODT resistor comprises an operation of setting a new resistance value corresponding to the DQ outside the preset dispersion range for response times on the basis of the measured resistance value.

6. The ODT resistance value setting method of claim 4, wherein the DRAM module includes a multi-rank dual in-line memory module (DIMM) module.

7. A computer program stored in a computer-readable medium in combination with hardware to execute an on-die termination (ODT) resistance value setting method of a dynamic random access memory (DRAM) device of claim 4.

8. The DRAM device of claim 1, wherein
- the memory controller sets the resistance value of the ODT resistor on a basis of a preset response time range, and
- the memory controller sets the resistance value of the ODT resistor to be lower in case that a value of a measured response time is bigger than a value of the preset response time range.

9. The ODT resistance value setting method of claim 4, wherein
- the operation of allowing the memory controller to set a resistance value of an ODT resistor comprises an operation of setting the resistance value of the ODT resistor on a basis of a preset dispersion range for response times, and
- the memory controller sets the resistance value of the ODT resistor to be lower in case that a value of a measured response time is bigger than a value of the preset response time range.

* * * * *